(12) United States Patent
Fan

(10) Patent No.: US 8,937,809 B2
(45) Date of Patent: Jan. 20, 2015

(54) DISPLAY DEVICE

(71) Applicant: Wistron Corporation, New Taipei (TW)

(72) Inventor: Feng Fan, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 179 days.

(21) Appl. No.: 13/831,823

(22) Filed: Mar. 15, 2013

(65) Prior Publication Data

US 2014/0185198 A1    Jul. 3, 2014

(30) Foreign Application Priority Data

Dec. 27, 2012    (CN) .......................... 2012 2 0736214

(51) Int. Cl.
*G06F 1/16* (2006.01)
*H05K 7/14* (2006.01)
*H05K 5/02* (2006.01)

(52) U.S. Cl.
CPC ............... *H05K 7/1461* (2013.01); *H05K 5/02* (2013.01); *Y10S 248/917* (2013.01)
USPC .............. 361/679.58; 361/679.22; 361/679.6; 248/121; 248/917

(58) Field of Classification Search
CPC .................................................... G06F 1/1601
USPC ........................................ 361/679.57–679.59
See application file for complete search history.

(56) References Cited

U.S. PATENT DOCUMENTS

| | | | | |
|---|---|---|---|---|
| 8,059,399 B2 * | 11/2011 | Huang | ..................... | 361/679.59 |
| 8,077,449 B2 * | 12/2011 | Mi et al. | ................... | 361/679.21 |
| 2006/0203438 A1 * | 9/2006 | Chiu et al. | .................... | 361/681 |
| 2007/0139871 A1 * | 6/2007 | Chiu | ............................. | 361/681 |

* cited by examiner

*Primary Examiner* — Anthony Q Edwards
(74) *Attorney, Agent, or Firm* — Winston Hsu; Scott Margo

(57) ABSTRACT

A display device includes a display module, a base and a fixing mechanism. The fixing mechanism includes a guiding component, a sliding component, a sliding lock and a recovering component. The sliding lock is for locking the sliding component in a locking position, and the sliding component can move relative to the guiding component as the sliding lock is pushed from the locking position to an unlocking position. As the sliding lock is in the unlocking position, two first hooks and two second hooks of the base pass through two installation holes and two engaging holes of the display module respectively, the two second hooks drive two engaging portions of the sliding component respectively, and the recovering component is for driving the sliding component, so that the two engaging portions are engaged with two first slots of the two second hooks respectively to fix the display module on the base.

12 Claims, 14 Drawing Sheets

DISPLAY DEVICE

BACKGROUND OF THE INVENTION

1. Field of the Invention

The present invention relates to a display device, and more specifically, to a display device with an easy assembly mechanism and a safety lock.

2. Description of the Prior Art

Display devices in the market, such as a Liquid Crystal Display (LCD) TV or a plasma TV and so on, become popular, and a size of the display device becomes larger to meet a user's requirement. Generally speaking, a display module of the display device is installed on a base of the display device, and a fixing mechanism is disposed between the display module and the base, so that the display module is easy to install on the base or detach from the base. However, the conventional fixing mechanism does not have a mechanism for preventing an error operation, so that the display module might be detached from the base due to the error operation by the user, resulting in damaging the user and other people. Therefore, it is an important issue to design a display device with an easy assembly fixing mechanism and capable of preventing the error operation.

SUMMARY OF THE INVENTION

The present invention is to provide a display device with an easy assembly and a safety lock to prevent a user from performing an error operation to solve the above problems.

According to the disclosure, a display device includes a display module, a base and a fixing mechanism. At least two installing holes and at least two engaging holes are formed on a side of the display module. The base is detachably installed on the display module, and the base includes at least two first hooks and at least two second hooks. A first slot is formed on each second hook. The fixing mechanism is disposed on the display module for fixing the display module on the base. The fixing mechanism includes a guiding component, a sliding component, a sliding lock, a resilient component and a recovering component. The guiding component is disposed inside the display module, and a second slot is formed on the guiding component. The sliding component is disposed inside the display module in a slidable manner relative to the guiding component. The sliding component includes a third slot, a column and at least two engaging portions, and each engaging portion is disposed corresponding to each engaging hole. The sliding lock is slidably connected to the sliding component. The sliding lock is for locking the sliding component in a locking position, and the sliding component moves relative to the guiding component as the sliding lock is pushed from the locking position to an unlocking position. The resilient component sheathes the column of the sliding component and is disposed between the sliding component and the sliding lock. The resilient component is for driving the sliding lock from the unlocking position to the locking position. The recovering component is disposed between the second slot and the third slot for driving the sliding component to move relative the guiding component, wherein the at least two first hooks and the at least two second hooks of the base pass through the at least two installing holes and the at least two engaging holes of the display module respectively, and the at least two second hooks drive the at least two engaging portions of the sliding component respectively as the sliding lock is in the unlocking position. The recovering component is for driving the sliding component, so that the at least two engaging portions are engaged with the at least two first slots of the at least two second hooks respectively to fix the display module on the base.

The present invention utilizes the fixing mechanism installed inside the display module to fix the display module on the base, so as to achieve a purpose of assembling the display module and the base quickly. It also solves the problem that the display module is detached from the base due to the error operation by the user, resulting in damaging the user and the other people. Furthermore, because the fixing mechanism is disposed inside the display module, it does not need to modify a design of the appearance, so as to decrease the manufacturing cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
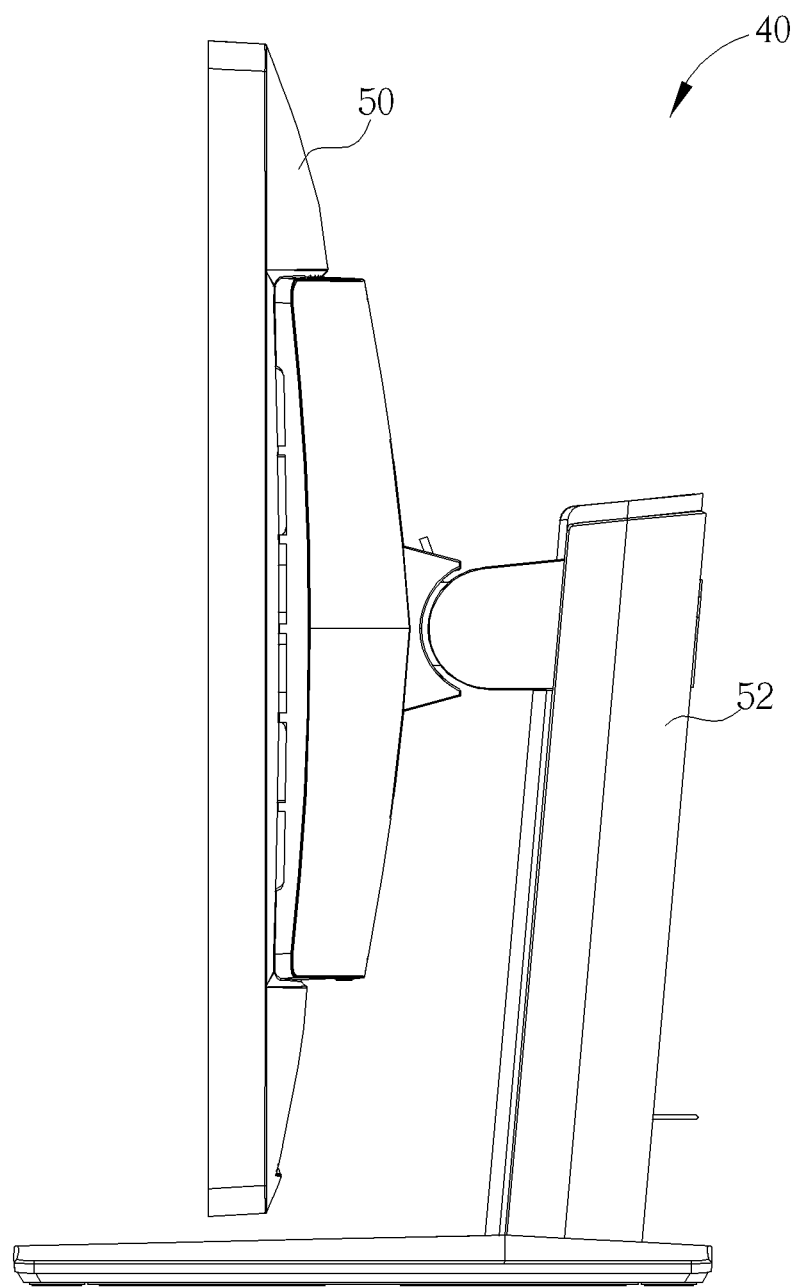
FIG. 1 is a side view of a display device according to an embodiment of the present invention.
Figure 2:
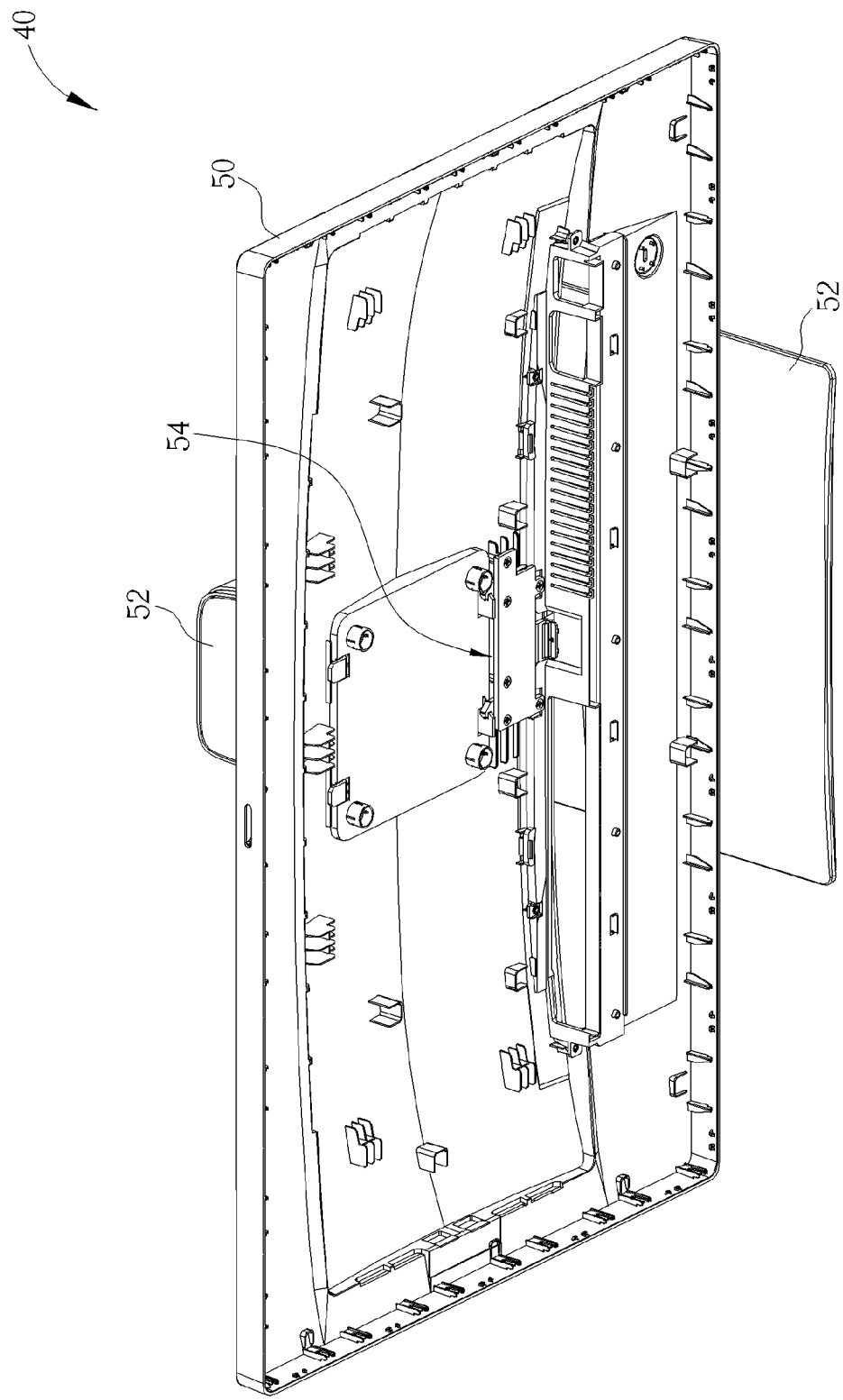
FIG. 2 is an internal structural diagram of the display device according to the embodiment of the present invention.
Figure 3:
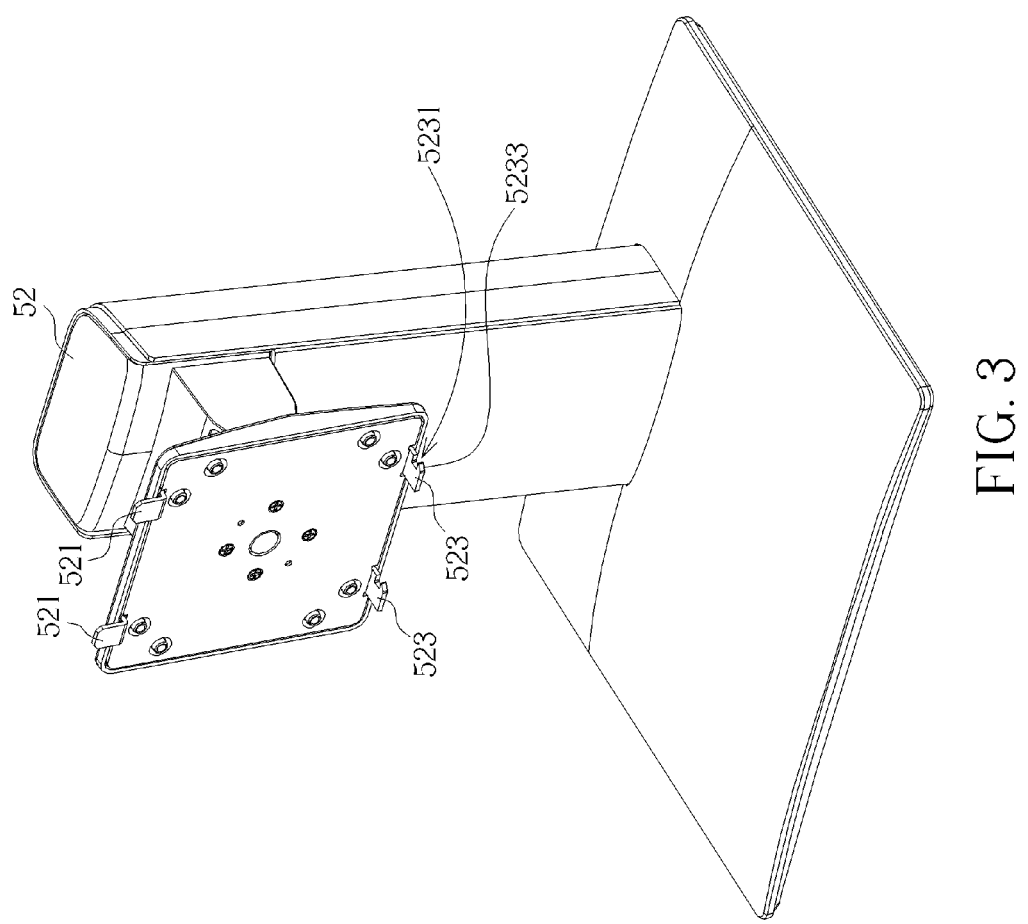
FIG. 3 is a diagram of a base according to the embodiment of the present invention.

Please refer to FIG. 1 to FIG. 3. FIG. 1 is a side view of a display device 40 according to an embodiment of the present invention. FIG. 2 is an internal structural diagram of the display device 40 according to the embodiment of the present invention. FIG. 3 is a diagram of a base 52 according to the embodiment of the present invention. The display device 40 can be a Liquid Crystal Display (LCD) TV or a plasma TV, and the display device 40 includes a display module 50, the base 52 and a fixing mechanism 54. The display module 50 is for displaying images. The base 52 is detachably installed on the display module 50, so as to support the display module 50 to be placed on a plane. For example, the display device 40 can be placed on furniture in a living room. The base 52 includes at least two first hooks 521 and at least two second hooks 523, and a first slot 5231 is formed on each second hook 523. In this embodiment, the base 52 includes the two first hooks 521 and the two second hooks 523. The fixing mechanism 54 is disposed on the display module 50 for fixing the display module 50 on the base 52.

Figure 4:
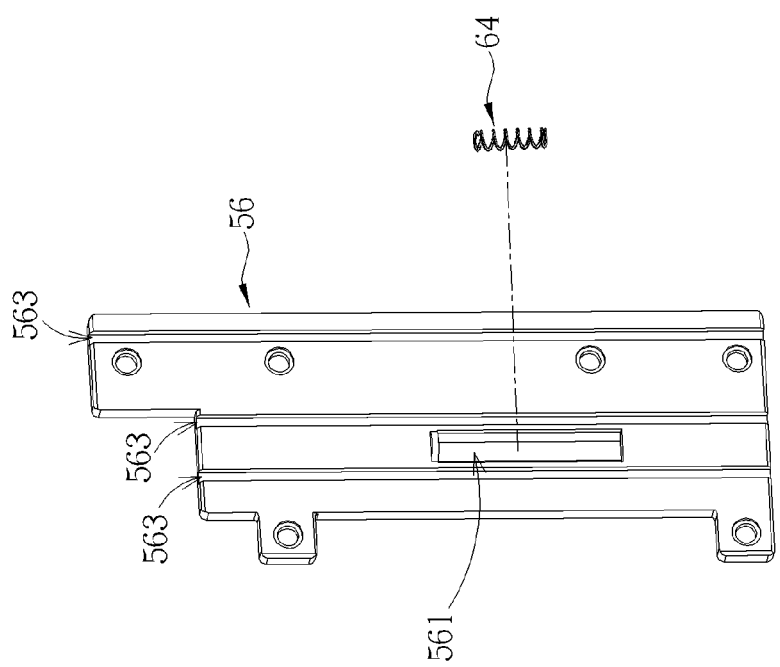
FIG. 4 is a diagram of a guiding component and a recovering component according to the embodiment of the present invention.
Figure 5:
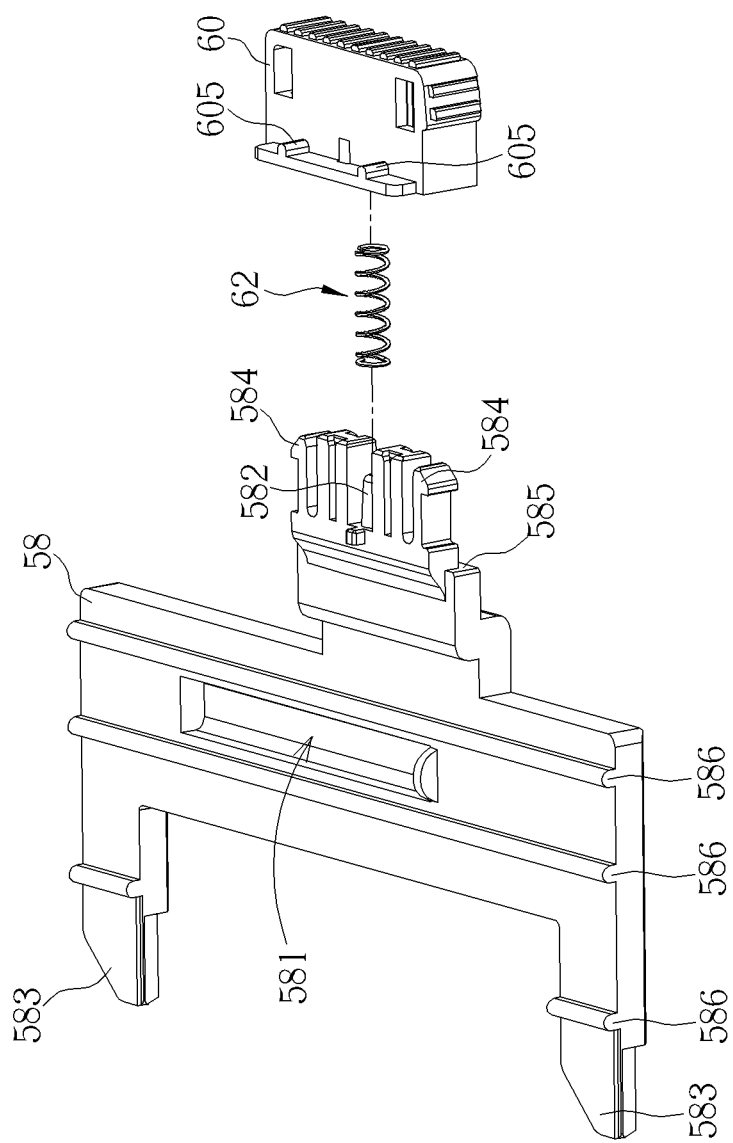
FIG. 5 is an exploded diagram of a sliding component, a sliding lock 60 and a resilient component according to the embodiment of the present invention.
Figure 6:
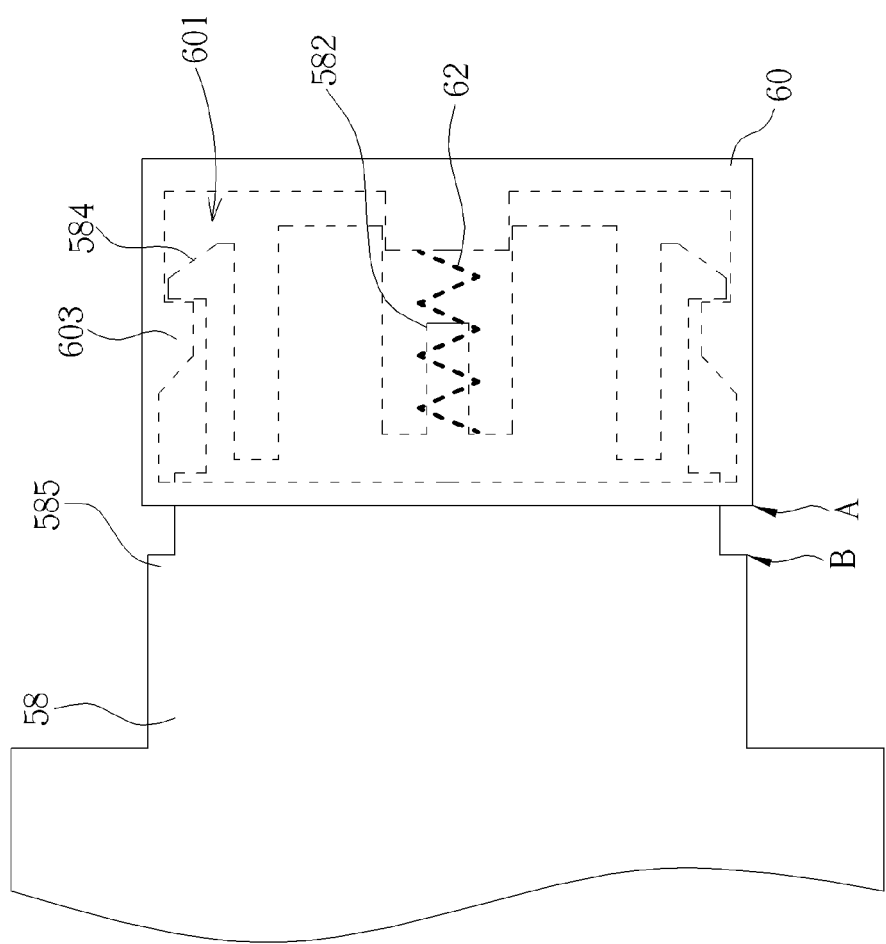
FIG. 6 is an assembly diagram of the sliding lock installed on the sliding component according to the embodiment of the present invention.
Figure 7:
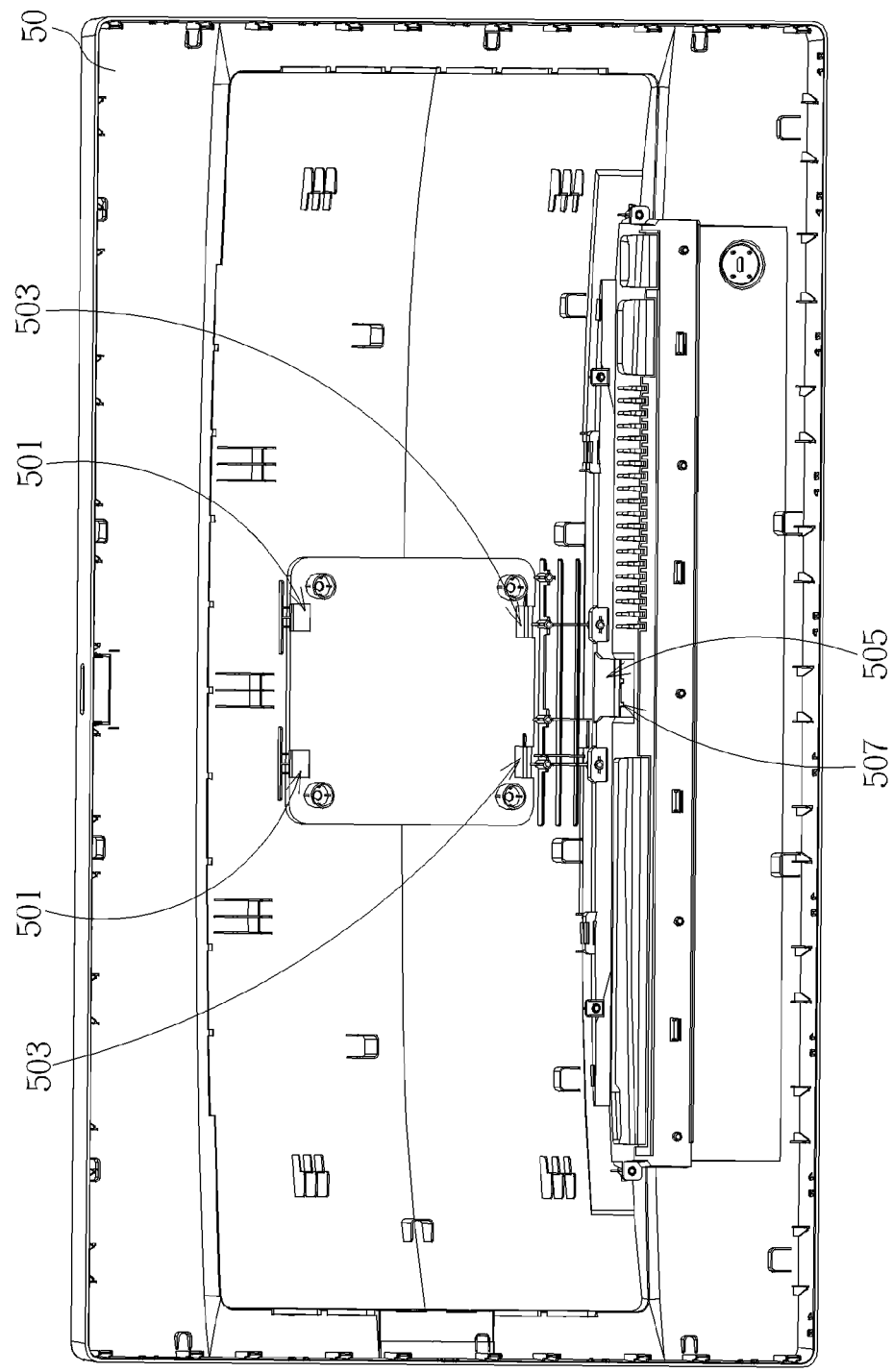
FIG. 7 is an internal structural diagram of the display module according to the embodiment of the present invention.
Figure 8:
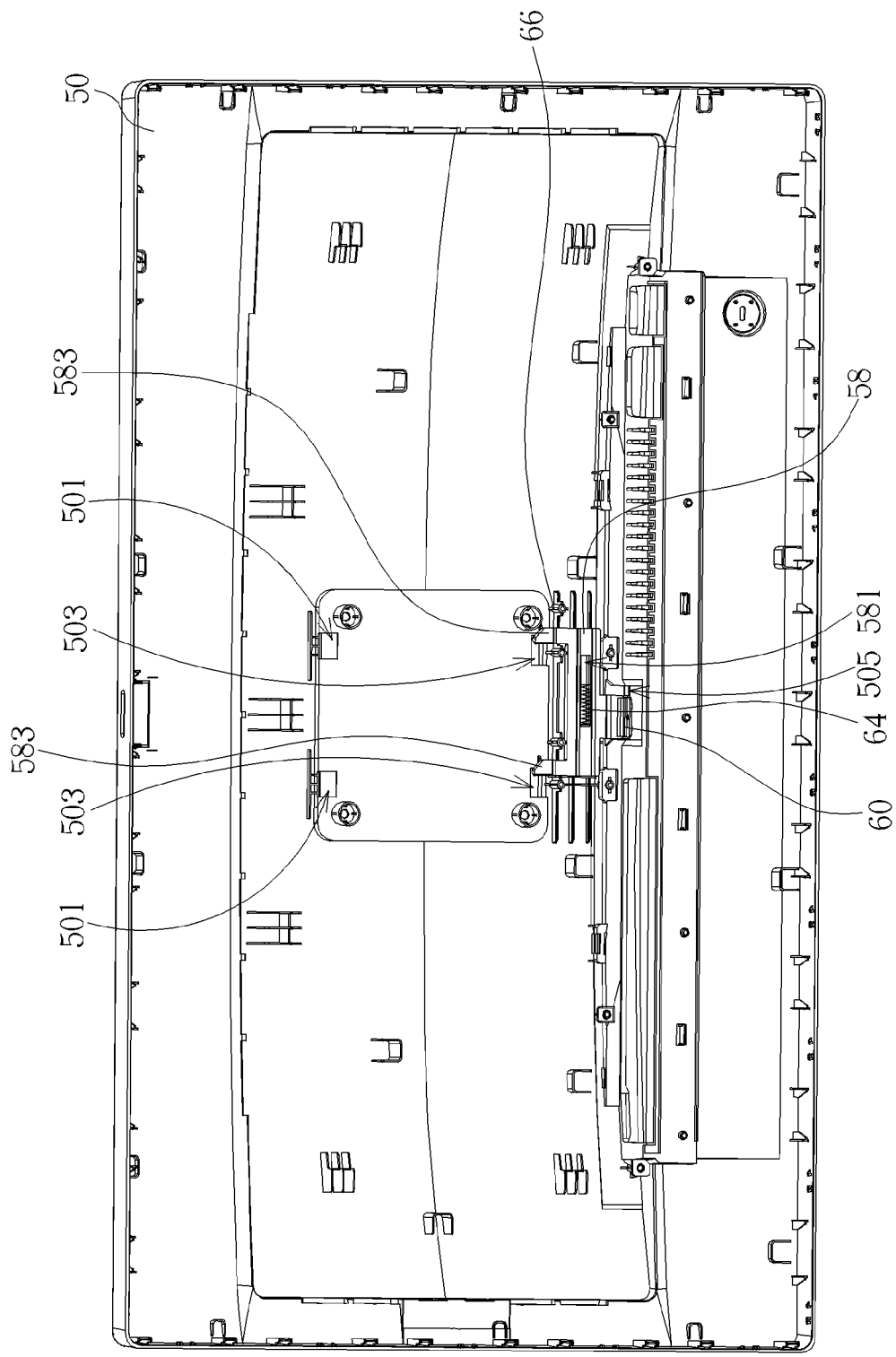
FIG. 8 is a diagram of the sliding component and the sliding lock 60 installed inside the display module according to the embodiment of the present invention.
Figure 9:
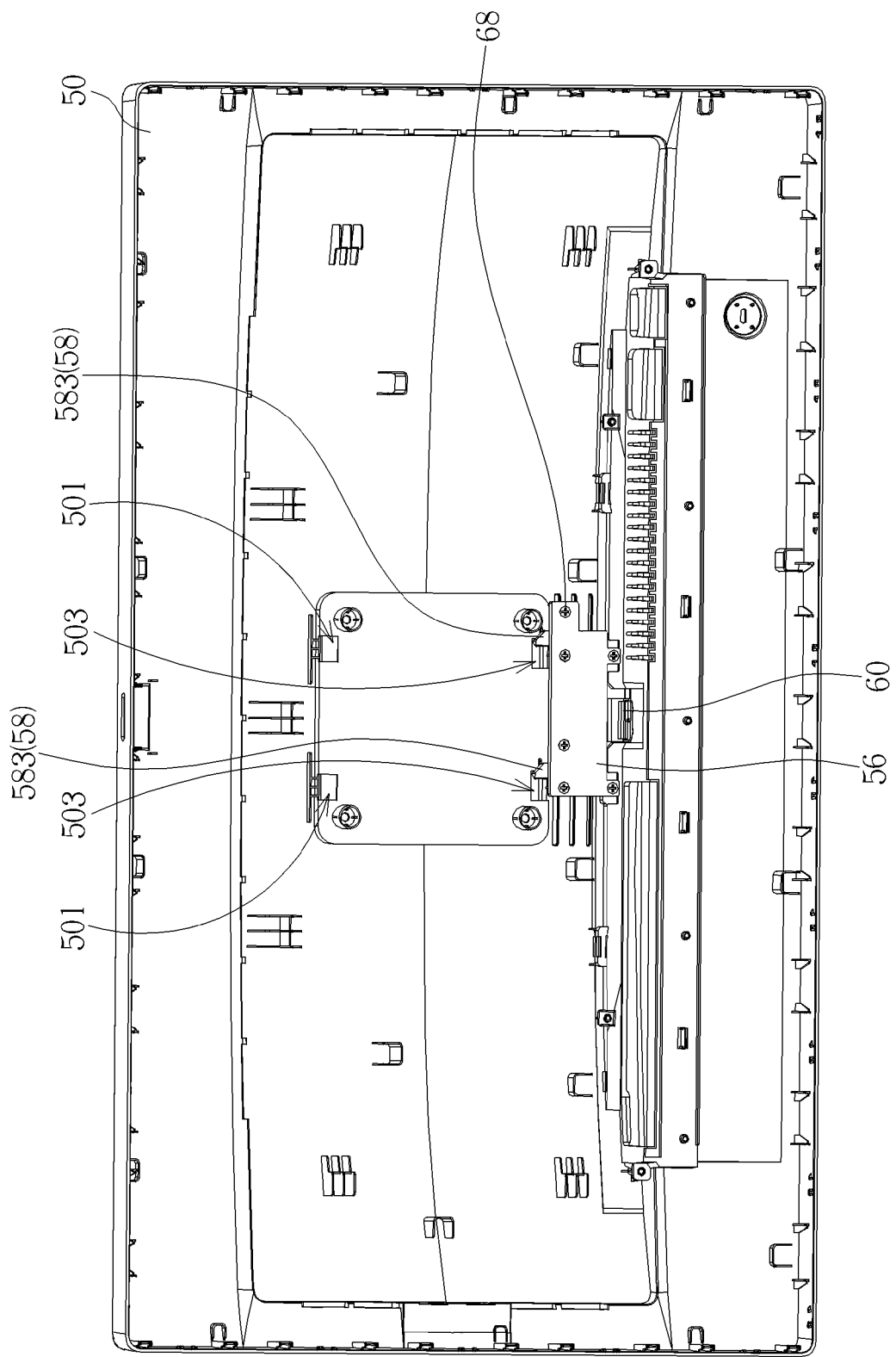
FIG. 9 is a diagram of the guiding component installed inside the display module according to the embodiment of the present invention.

Furthermore, the fixing mechanism 54 includes a guiding component 56, a sliding component 58, a sliding lock 60, a resilient component 62 and a recovering component 64. Please refer to FIG. 4 to FIG. 9. FIG. 4 is a diagram of the guiding component 56 and the recovering component 64 according to the embodiment of the present invention. FIG. 5 is an exploded diagram of the sliding component 58, the sliding lock 60 and the resilient component 62 according to the embodiment of the present invention. FIG. 6 is an assembly diagram of the sliding lock 60 installed on the sliding component 58 according to the embodiment of the present invention. FIG. 7 is an internal structural diagram of the display module 50 according to the embodiment of the present invention. FIG. 8 is a diagram of the sliding component 58 and the sliding lock 60 installed inside the display module 50 according to the embodiment of the present invention. FIG. 9 is a diagram of the guiding component 56 installed inside the display module 50 according to the embodiment of the present invention. The guiding component 56 is disposed inside the display module 50, and a second slot 561 is formed on the guiding component 56. The sliding component 58 is disposed inside the display module 50 in a slidable manner relative to the guiding component 56, and the sliding component 58 includes a third slot 581, a column 582 and at least two engaging portions 583. In this embodiment, the sliding component 58 includes the two engaging portions 583. The sliding lock 60 is slidably connected to the sliding component 58. The sliding lock 60 is for locking the sliding component 58 in a locking position A, and the sliding component 58 can move relative to the guiding component 56 as the sliding lock 60 is pushed from the locking position A to an unlocking position B.

As shown in FIG. 6, at least one engaging slot 601 is formed on the sliding lock 60, and the sliding component 58 further includes at least one engaging component 584 slidably engaged with the at least one engaging slot 601. The sliding component 58 can further include at least one constraining structure 585 for constraining movement of the sliding lock 60. That is, the at least one constraining structure 585 constrains the movement of the sliding lock 60 to the unlocking position B. At least one block 603 is formed on the sliding lock 60, and the at least one block 603 is disposed on an end of the at least one engaging slot 601 for stopping the at least one engaging component 584, so as to prevent the sliding lock 60 from separating from the sliding component 58. The resilient component 62 sheathes the column 582 of the sliding component 58 and is disposed between the sliding component 58 and the sliding lock 60. The resilient component 62 is for driving the sliding lock 60 from the unlocking position B to the locking position A.

Please refer to FIG. 5 to FIG. 9. At least two installing holes 501 and at least two engaging holes 503 are formed on a side of the display module 50. In this embodiment, the two installing holes 501 and the two engaging holes 503 are formed on the side of the display module 50. An opening 505 is further formed on the display module 50, and the sliding lock 60 passes through the opening 505 so as to be exposed outside the display module 50. At least one locking slot 507 is further formed on the display module 50, and the sliding lock 60 can include at least one locking block 605 for engaging with the at least one locking slot 507 so as to lock the sliding component 58 as the sliding lock 60 is in the locking position A. As shown in FIG. 5, in this embodiment, the sliding lock 60 can include the two locking blocks 605. As shown in FIG. 7, the two locking slots 507 corresponding to the two locking blocks 605 are formed on the display module 50. After the resilient component 62 and the sliding lock 60 are installed on the sliding component 58, the resilient component 62, the sliding lock 60 and the sliding component 58 can be installed inside the display module 50, as shown in FIG. 8. At this time, the sliding lock 60 passes through the opening 505 so as to be exposed outside the display module 50, and each engaging portion 583 is disposed on a position corresponding to each engaging hole 503. In addition, the display module 50 can further include a plurality of constraining columns 66 for constraining movement of the sliding component 58 relative to the guiding component 56. That is, as shown in FIG. 8, the display module 50 can include four constraining columns 66 in this embodiment, and each engaging portion 583 of the sliding component 58 is disposed between the corresponding two constraining columns 66 respectively. Next, after the recovering component 64 is disposed on the third slot 581, as shown in FIG. 9, the guiding component 56 is disposed on the sliding component 58. Finally, a plurality of fixing components 68 are for fixing the guiding component 56 on the display module 50. As shown in FIG. 9, the display module 50 can include six fixing components 68 for fixing the guiding component 56 on the display module 50, and each fixing component 68 can be a screw component.

Figure 10:
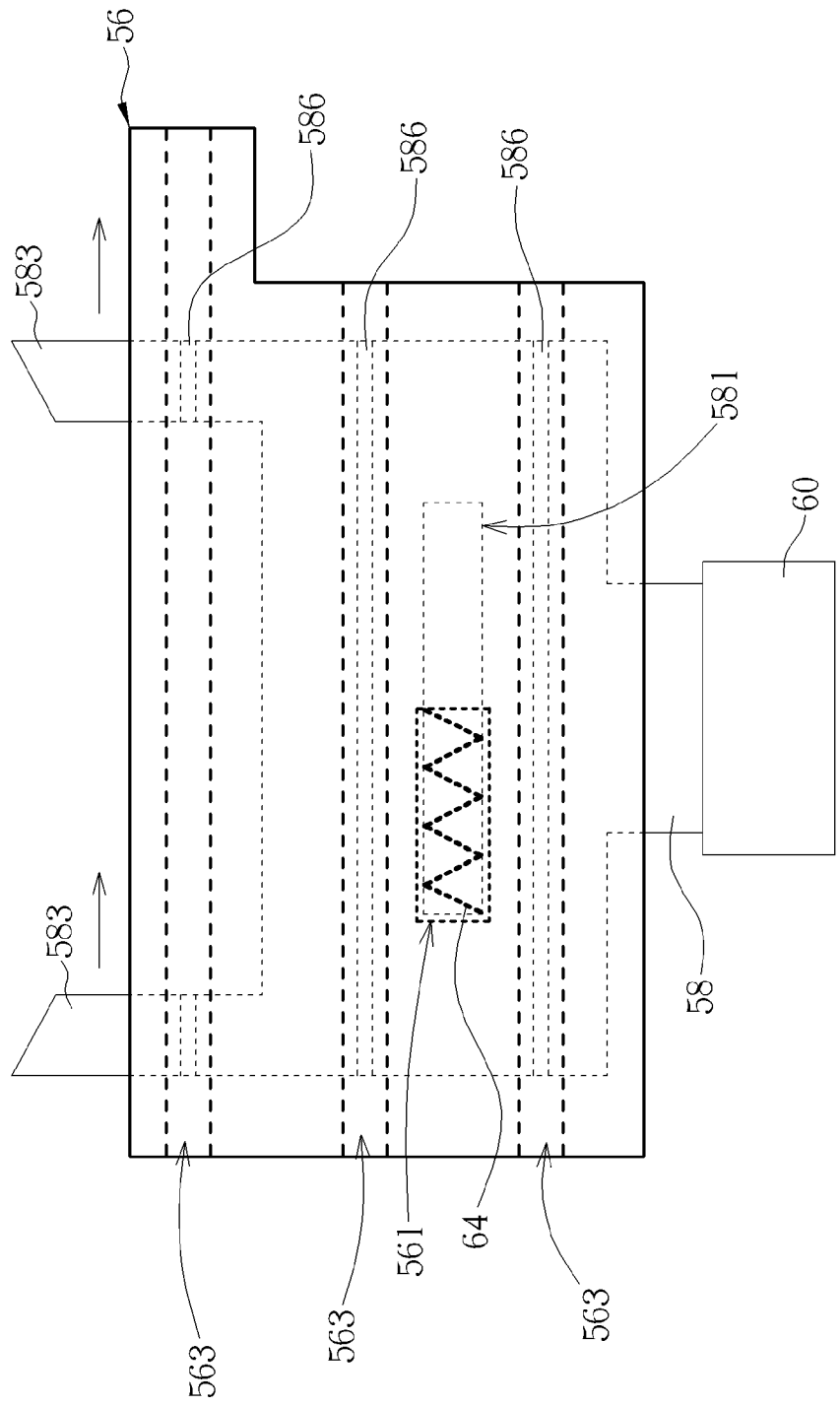
FIG. 10 and FIG. 11 are diagrams of the guiding component disposed on the sliding component according to the embodiment of the present invention.
Figure 11:
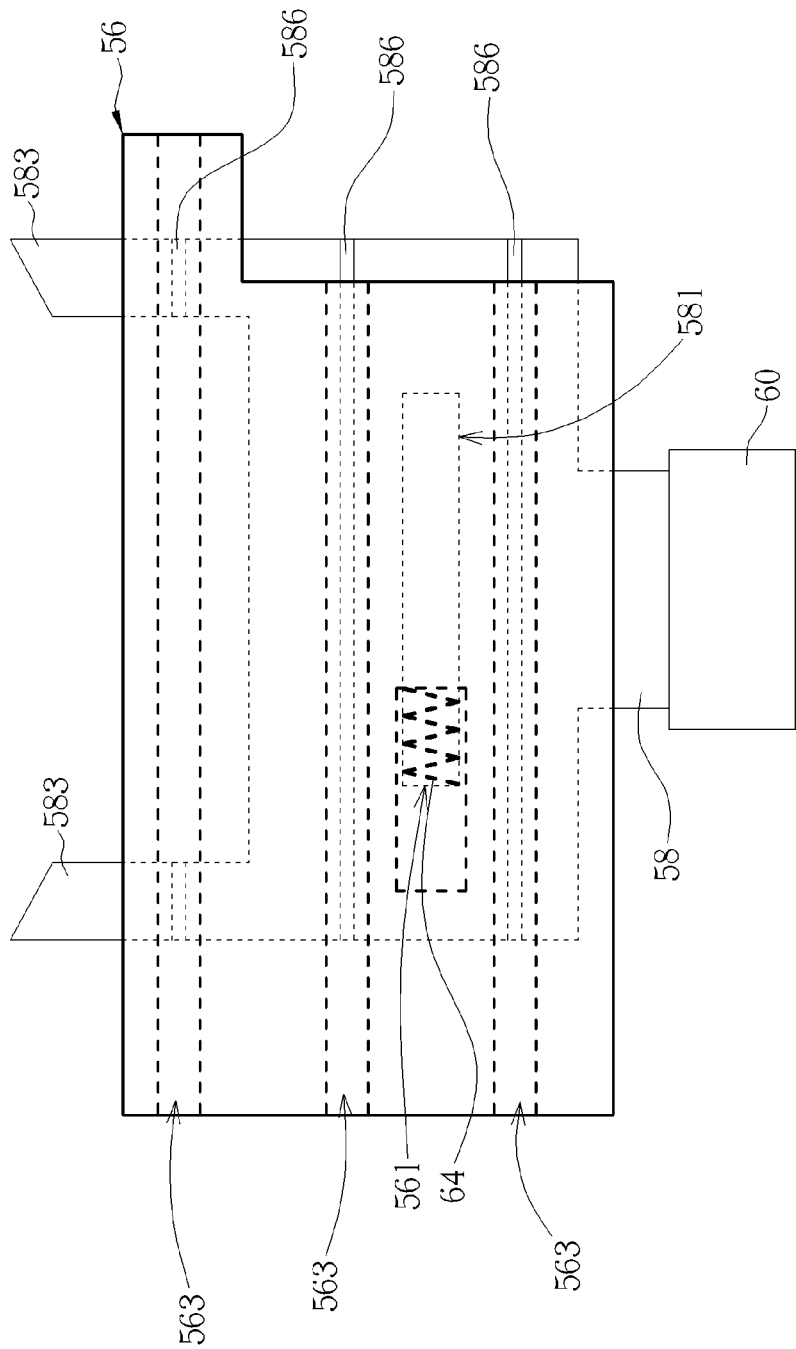

Please refer to FIG. 10 and FIG. 11. FIG. 10 and FIG. 11 are diagrams of the guiding component 56 disposed on the sliding component according to the embodiment of the present invention. The recovering component 64 is disposed between the second slot 561 and the third slot 581 for driving the sliding component 58 to move relative the guiding component 56. Furthermore, a plurality of guiding slots 563 is disposed on the guiding component 56, and a plurality of guiding tracks 586 corresponding to the plurality of the guiding slots 563 is disposed on the sliding component 58 and respectively installed inside the plurality of the guiding slots 563, so as to guide the sliding component 58 to move relative to the guiding component 56. In this embodiment, three guiding slots 563 and three guiding tracks 586 can be respectively disposed on the guiding component 56 and the sliding component 58. It is noticed that a length of the third slot 581 is greater than a length of the second slot 561. Therefore, as the sliding component 58 moves relative to the guiding component 56 in an arrow direction shown in FIG. 10, as shown in FIG. 11, two ends of the recovering component 64 are pressed by lateral walls of the second slot 561 and the third slot 581 cooperatively, so that the recovering component 64 deforms resiliently so as to store resilient potential for driving the sliding component 58 to move in a direction opposite to the arrow direction shown in FIG. 10 to a position shown in FIG. 10.

Figure 12:
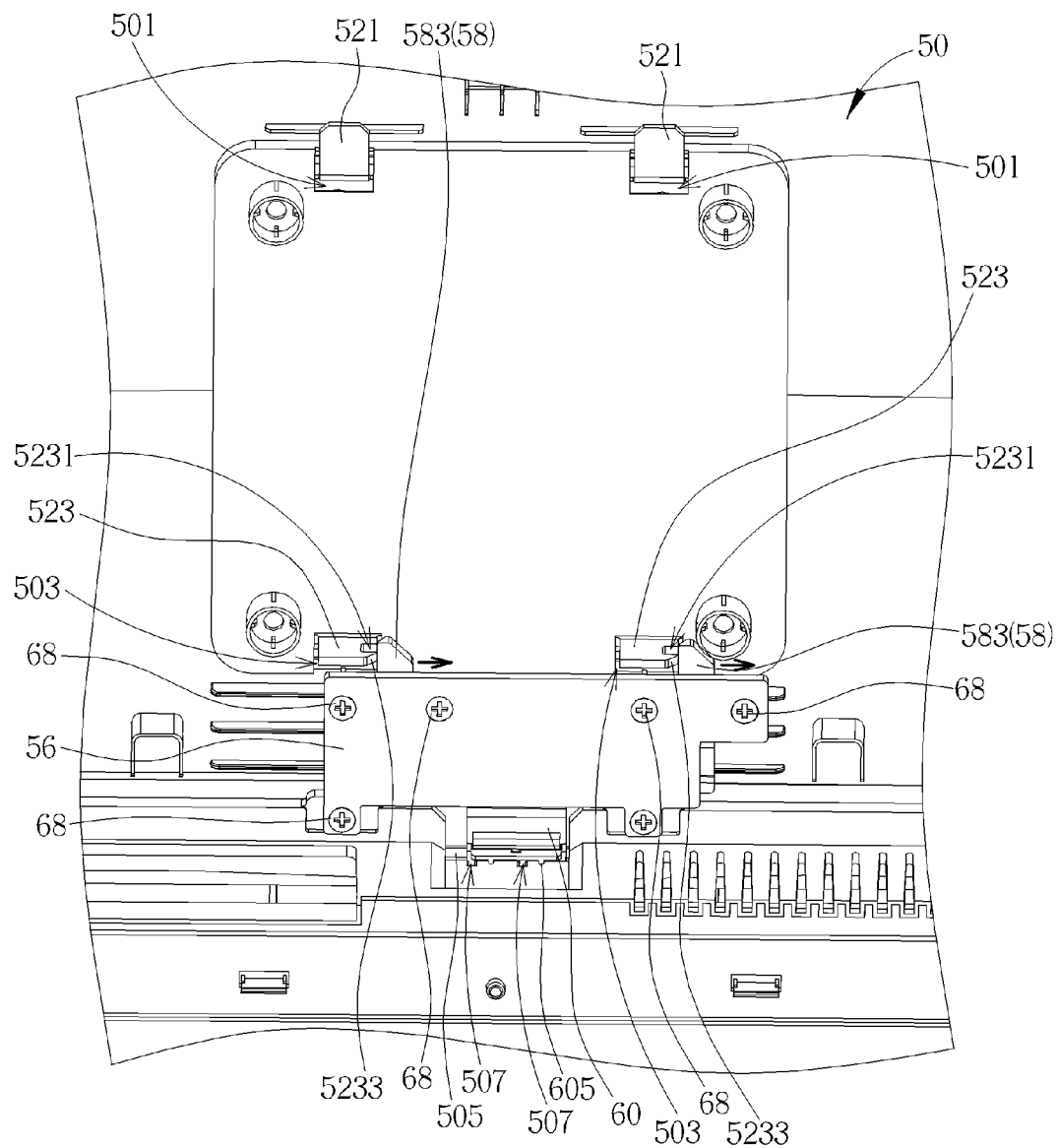
FIG. 12 is a diagram of two second hooks engaged with two engaging holes according to the embodiment of the present invention.
Figure 13:
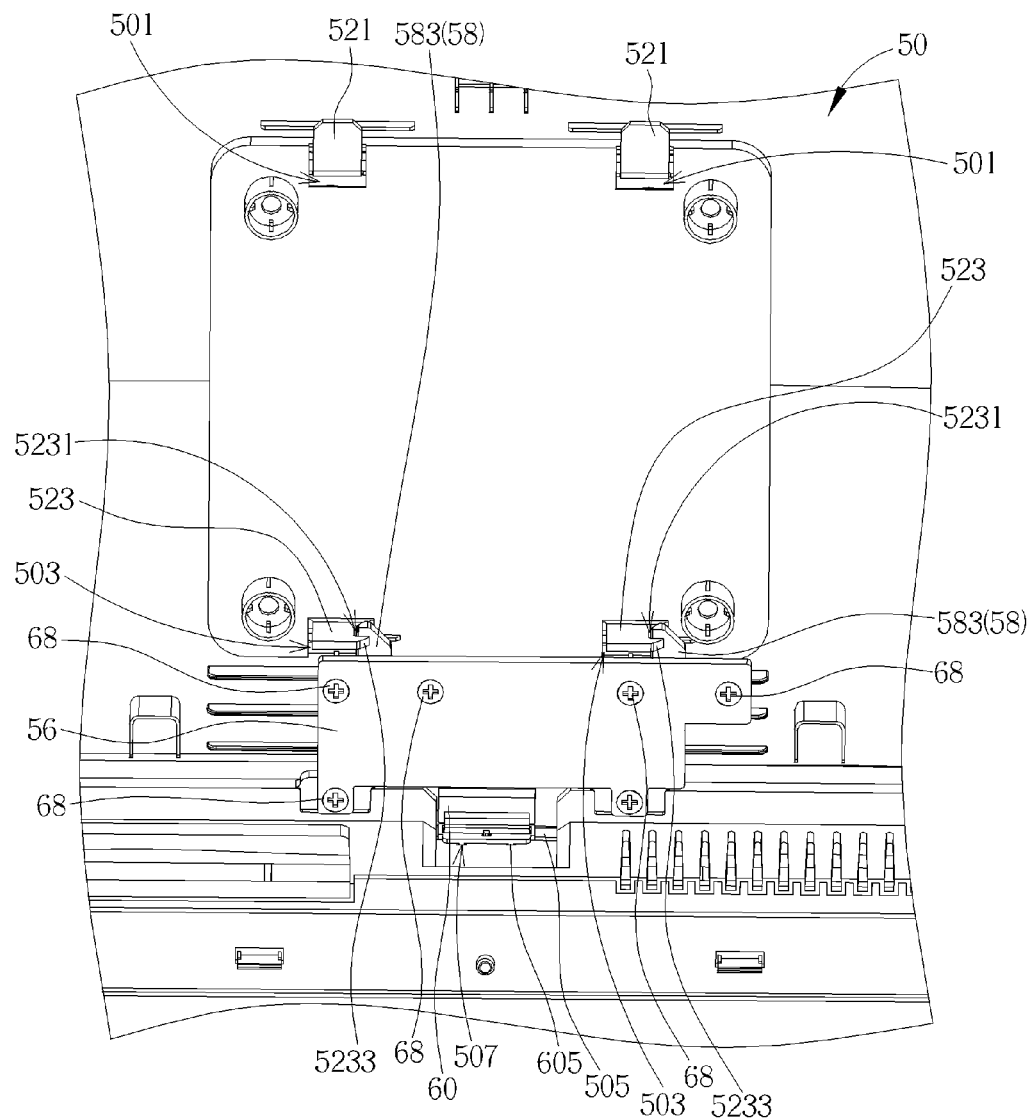
FIG. 13 and FIG. 14 are diagrams of the two second hooks engaged with two engaging portions according to the embodiment of the present invention.
Figure 14:
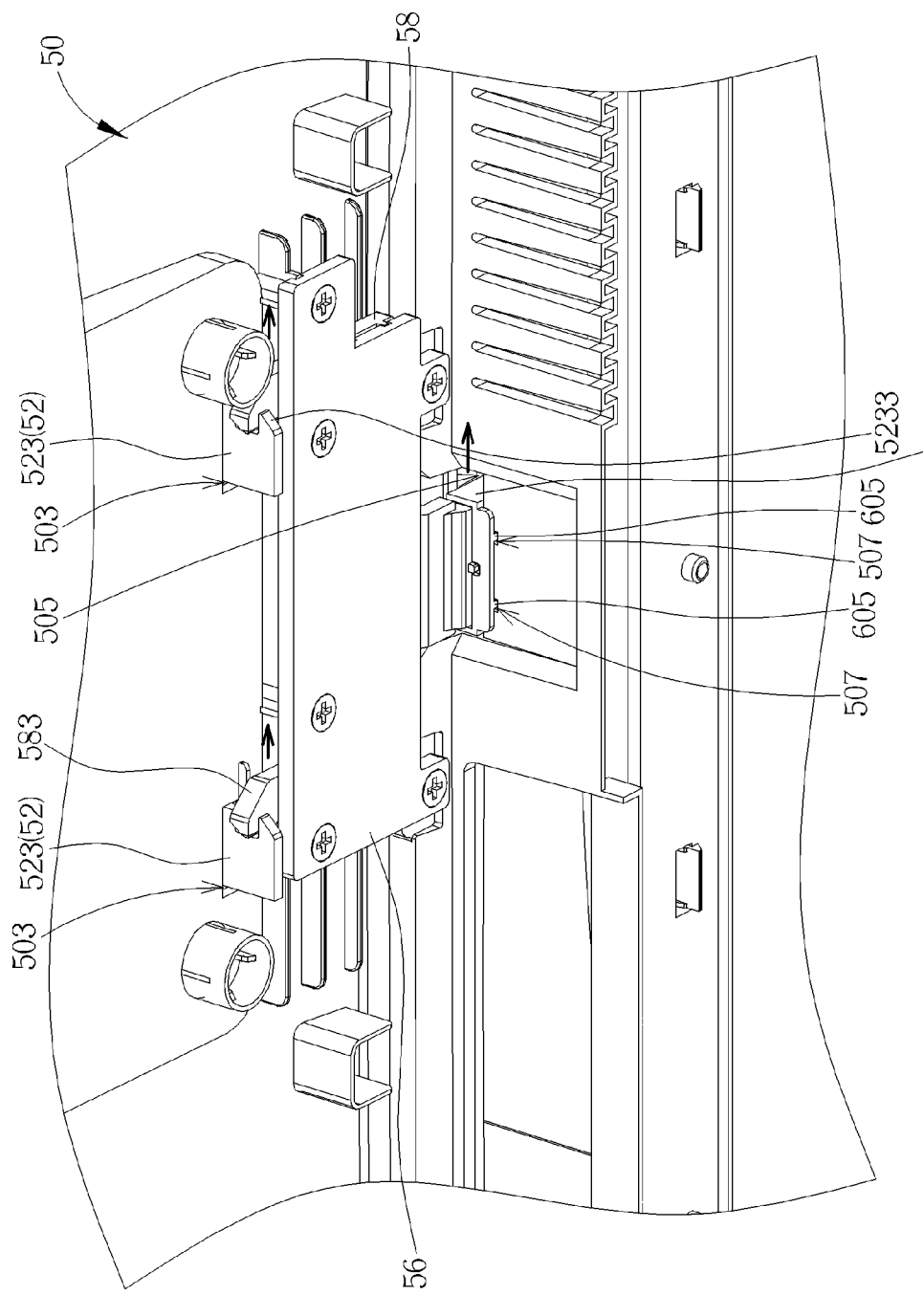

A procedure for fixing the display module 50 on the base is described as follows. Please refer to FIG. 6, and FIG. 12 to FIG. 14. FIG. 12 is a diagram of the two second hooks 523 engaging with the two engaging holes 503 according to the embodiment of the present invention. FIG. 13 and FIG. 14 are diagrams of the two second hooks 523 engaging with the two engaging portions 583 according to the embodiment of the present invention. First, the sliding lock 60 is pushed to the unlocking position B, so that the two locking blocks 605 are respectively separated from the two locking slots 507. At this time, the sliding component 58 connected to the sliding lock 60 is not constrained and can move relative to the guiding component 56. Next, as the sliding lock 60 is in the unlocking position B, each first hooks 521 and each second hooks 523 on the base 52 pass through each installing hole 501 and each engaging hole 503 on the display module 50 respectively, and each engaging portion 583 of the sliding component 58 is on the position corresponding to the corresponding engaging hole 503 at the same time. As a result, each second hook 523 can drive the corresponding engaging portion 583 respectively, so that the sliding component 58 moves relative to the guiding component 56 in an arrow direction shown in FIG. 12. An inclined structure 5233 is formed on each second hook 523 for guiding the corresponding engaging portion 583 to engage with the first slot 5231 as each second hook 523 drives the corresponding engaging portion 583. As each engaging portion 583 is disposed inside the corresponding first slot 5231, each second hook 523 does not drive the corresponding engaging portion 583. Therefore, the recovering component 64 drives the sliding component 58 so that each engaging portion 583 is engaged with the corresponding first slot 5231 of the corresponding second hook 523 to fix the display module 50 on the base 52.

At this time, the sliding lock 60 can be released, and the resilient component 62 can drive the sliding lock 60 from the unlocking position B back to the locking position A, so that the two locking blocks 605 are engaged with the two locking slots 507 to fix the sliding component 58. Therefore, the sliding lock 60 is used for preventing an error operation of detaching the display module 50 from the base 52 accidentally, resulting in damaging a user and other people. As it is desired to detach the display module 50 from the base 52, it only needs to push the sliding lock 60 from the locking position A as shown in FIG. 6 to the unlocking position B. Then, the sliding lock 60 is pushed to move in an arrow direction shown in FIG. 14 to drive the sliding component 58 to move in the arrow direction, so that each engaging portion 583 is detached from the corresponding first slot 5231. As a result, each first hook 521 and each second hook 523 of the base 52 can be detached from the corresponding installing hole 501 and the corresponding engaging hole 503 of the display module 50, so as to detach the display module 50 from the base 52. In addition, a mechanism for driving each engaging portion 583 to detach from the corresponding first slot 5231 is not limited to this embodiment. For example, an opening can be formed on a position of the sliding component 58 corresponding to the display module 50, so that partial components of the sliding component 58 can be exposed outside the opening as each engaging portion 583 is engaged with the corresponding first slot 5231 of the corresponding second hook 523. Therefore, the partial components of the sliding component 58 can be pushed by the user directly, so that each engaging portion 583 is detached from the corresponding first slot 5231.

In contrast to the prior art, the present invention utilizes the fixing mechanism installed inside the display module to fix the display module on the base, so as to achieve a purpose of assembling the display module and the base quickly. It also solves the problem that the display module is detached from the base due to the error operation by the user, resulting in damaging the user and the other people. Furthermore, because the fixing mechanism is disposed inside the display module, it does not need to modify a design of the appearance of the display module, so as to decrease the manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device, comprising:
   a display module, at least two installing holes and at least two engaging holes being formed on a side of the display module;
   a base detachably installed on the display module, the base comprising at least two first hooks and at least two second hooks, and a first slot being formed on each second hook; and
   a fixing mechanism disposed on the display module for fixing the display module on the base, the fixing mechanism comprising:
      a guiding component disposed inside the display module, a second slot being formed on the guiding component;
      a sliding component disposed inside the display module in a slidable manner relative to the guiding component, the sliding component comprising a third slot, a column and at least two engaging portions, and each engaging portion being disposed corresponding to each engaging hole;
      a sliding lock slidably connected to the sliding component, the sliding lock being for locking the sliding component in a locking position, and the sliding component moving relative to the guiding component as the sliding lock is pushed from the locking position to an unlocking position;
      a resilient component sheathing the column of the sliding component and disposed between the sliding component and the sliding lock, the resilient component being for driving the sliding lock from the unlocking position to the locking position; and
      a recovering component disposed between the second slot and the third slot for driving the sliding component to move relative the guiding component, wherein the at least two first hooks and the at least two second hooks of the base pass through the at least two installing holes and the at least two engaging holes of the display module respectively, and the at least two second hooks drive the at least two engaging portions of the sliding component respectively as the sliding lock is in the unlocking position, and the recovering component is for driving the sliding component, so that the at least two engaging portions are engaged with the at least two first slots of the at least two second hooks respectively to fix the display module on the base.

2. The display device of claim 1, wherein a plurality of guiding slots is disposed on the guiding component, and a plurality of guiding tracks corresponding to the plurality of the guiding slots is disposed on the sliding component and respectively installed inside the plurality of the guiding slots, so as to guide the sliding component to move relative to the guiding component.

3. The display device of claim 1, wherein a length of the third slot is greater than a length of the second slot.

4. The display device of claim 1, wherein an inclined structure is formed on each second hook for guiding the corresponding engaging portion to engage with the first slot.

5. The display device of claim 1, wherein the display module further comprises a plurality of constraining columns for constraining movement of the sliding component relative to the guiding component.

6. The display device of claim 1, wherein the display module further comprises a plurality of fixing components for fixing the guiding component on the display module.

7. The display device of claim 1, wherein an opening is formed on the display module, and the sliding lock passes through the opening so as to be exposed outside the display module.

8. The display device of claim 7, wherein at least one locking slot is further formed on the display module, and the sliding lock comprises at least one locking block for engaging with the at least one locking slot so as to lock the sliding component as the sliding lock is in the locking position.

9. The display device of claim 8, wherein the at least one locking block separates from the at least one locking slot as the sliding lock is pushed to the unlocking position, so that the sliding component slides relative to the guiding component.

10. The display device of claim 1, wherein at least one engaging slot is formed on the sliding lock, and the sliding component further comprises at least one engaging component slidably engaged with the at least one engaging slot.

11. The display device of claim 10, wherein the sliding component further comprises at least one constraining structure for constraining movement of the sliding lock.

12. The display device of claim 10, wherein at least one block is formed on the sliding lock, and the at least one block is disposed on an end of the at least one engaging slot for stopping the at least one engaging component.

* * * * *